United States Patent [19]

Murdock

[11] 3,908,173

[45] Sept. 23, 1975

[54] DIFFERENTIAL AMPLIFYING SYSTEM WITH FORCED DIFFERENTIAL FEEDBACK

[75] Inventor: Bruce K. Murdock, Goleta, Calif.

[73] Assignee: General Motors Corporation, Detroit, Mich.

[22] Filed: May 13, 1974

[21] Appl. No.: 469,312

[52] U.S. Cl. .................... 330/30 D; 330/9; 330/35; 330/69; 330/85; 330/103

[51] Int. Cl.² .................... H03F 3/68

[58] Field of Search .................... 330/9, 30 D, 35, 69, 103, 330/85, 107

[56] References Cited

UNITED STATES PATENTS 3,509,460 4/1970 Mizrahi .................... 330/9

*Primary Examiner*—R. V. Rolinec
*Assistant Examiner*—Lawrence J. Dahl
*Attorney, Agent, or Firm*—Albert F. Duke

[57] ABSTRACT

A differential amplifying system including a differential input, differential output first stage coupled to a differential input, single ended output second stage with forced differential feedback from the second stage to the first stage including an in-phase channel and an out-of-phase channel.

3 Claims, 1 Drawing Figure

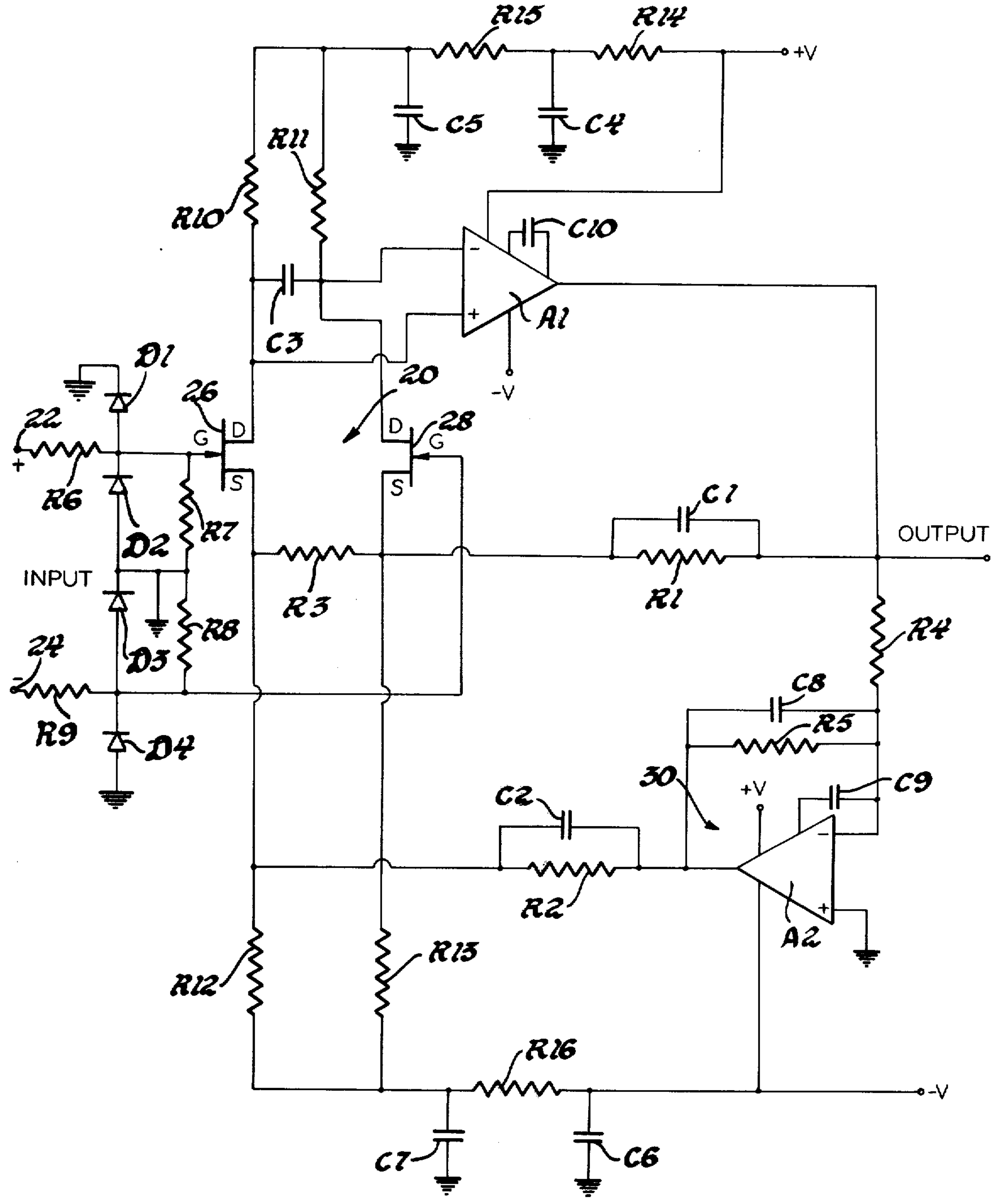
R15
R14
+V
C5
C4
R11
R10
C10
C3
A1
-V
D1
26
20
28
22
G
D
D
G
+
S
S
R6
R7
C1
D2
OUTPUT
INPUT
R3
R1
R8
24
D3
R4
R9
C8
R5
D4
30
+V
C9
C2
R2
A2
R12
R13
R16
-V
C7
C6

DIFFERENTIAL AMPLIFYING SYSTEM WITH FORCED DIFFERENTIAL FEEDBACK

This invention relates to differential amplifiers and more particularly to an amplifying system exhibiting low capacity balanced inputs as a result of forced differential feedback.

A differential amplifier is one which provides an output that is proportional to the difference between two input signals. In many applications the source of the input signals exhibits a capacitive output impedance. One example is a differential output piezoelectric hydrophone. To achieve maximum detection sensitivity and minimum crosstalk, a low noise, low capacitance differential input pre-amplifier is required to condition the signals of the source. The conventional differential input-single ended output amplifier with negative feedback exhibits a negative input capacity at the negative input terminal. The negative input capacity is a potential source of instability and must be swamped out by adding an adjustable capacitor. Since the input capacity is also a function of the capacity of the input stage, and this capacity can change with time, temperature, and operating conditions, even more swamping capacity must be added to reduce the percentage contribution of these varying capacities relative to the total input capacity of the amplifier to within acceptable limits. This added capacity forms a capacitive voltage divider with the source output capacity and hence reduces the apparent sensitivity. A further addition to the input capacitance of the amplifier occurs as a result of the Miller effect since a common mode signal arising from the unbalanced nature of the feedback is present at the output terminals of the first stage. The common mode signal is a function of the normal mode input signal and since the common mode signal is larger than the input signal from the source, it will cause the input-output capacity of the first stage to appear multiplied and in shunt across the input of the first stage, further reducing the apparent sensitivity of the capacitive source. Depending on circuit values, the common mode signal can experience amplification from the feedback point to the output of the first stage. When the clamp capacity of the source is small, the output of the first stage can be capacitively coupled to the input of the first stage producing overall amplifier instability. One approach to the solution of the problem presented by unbalanced feedback from the single ended output stage is shown in the patent to Heller U.S. Pat. No. 3,629,719. In the patented differential amplifying system the two input signals are applied to respective positive inputs of a pair of operational amplifiers each of whose output is coupled by a feedback resistor to the negative input thus providing differential feedback in the first stage. The outputs of the first stage are coupled to a differential input-single ended output stage. The patented system thus utilizes a two step amplification procedure. First, the differential signal is impedance buffered and differentially amplified and secondly, the differential signal is converted to a single ended signal. This approach requires three operational amplifiers and necessitates seven resistors to set the overall gain.

It is an object of the present invention to provide an improved differential amplifier system which is relatively insensitive to changes in the characteristics of the source of input signals with time and temperature.

It is another object of the present invention to provide an amplifying system exhibiting a completely balanced input impedance without the necessity for active device matching, common mode rejection in the amplifier stages, or local feedback loops.

It is another object of the present invention to provide an amplifying system exhibiting temperature independence and long term stability by providing overall forced differential feedback from the output stage to the input stage.

These and other objects of the present invention are obtained in accordance with a preferred embodiment of the invention which includes a first stage having differential inputs and differential outputs. The output of the first stage provides the input to a differential input single-ended output operational amplifier. The single-ended output of the second stage is fed back to the first stage through a forced differential feedback loop including an in-phase channel and an out-of-phase channel. The out-of-phase channel includes a high speed, inverting unity gain operational amplifier. Thus, the output of the amplifying system of the present invention is single-ended without requiring a separate differential to single ended conversion stage. The feedback connection encloses the entire amplifier so that as long as the open loop gain of the amplifier is large the overall transfer function is determined solely by the passive components in the feedback path. Temperature independent and long term stability are readily achievable in these components. A completely balanced input impedance is accomplished by the forced differential feedback eliminating the need for active device matching, common mode rejection in the amplifier stage, or local feedback loops.

A more complete understanding of the present invention may be had from the following detailed description which should be read in conjunction with the accompanying drawing whose single FIGURE is a schematic diagram of a preferred embodiment of the differential amplifying system of the present invention.

Referring now to the drawing, the differential amplifying system of the present invention includes a differential-input, differential-output stage generally designated 20 having a positive input terminal 22 and a negative input terminal 24 for connection with the source of input signals. The input stage 20 comprises a pair of three terminal amplifying devices 26 and 28. The amplifying devices 26 and 28 may be field effect transistors, as shown, each having source, drain, and gate electrodes designated S, D, and G respectively. The drain electrodes of the transistors 26 and 28 are connected with the non-inverting and inverting inputs respectively of a differential input, single-ended output operational amplifier A1 from which the output of the system is obtained. A signal which is in phase with the output of the amplifier A1 is fed back to the input stage 20 through a feedback channel including a resistor R1. A signal which is out of phase with the output of the amplifier A1 is fed to the input stage 20 through a feedback channel comprising a high speed wide bandwidth inverting unity gain amplifier generally designated 30, and a resistor R2. A differential feedback signal is developed across a resistor R3 which is common to both feedback channels. The amplifier 30 comprises an operational amplifier A2, a resistor R4 connecting the output of the amplifier A1 with the inverting input of the amplifier A2 and a resistor R5 interconnecting the output and inverting input of the amplifier A2. The amplifier A2 should exhibit minimal phase shift so its output is an inverted replica of its input within the bandwidth of interest. The amplifier A2 used in the circuit is the LM101A, manufactured by National Semiconductor Corporation, with capacitors C8 and C9 added to provide feedforward compensation to insure high speed wide bandwidth response. Other amplifiers with inherent high speed wide bandwidth response would not require C8 and C9.

The remaining circuit components of the amplifying system include input protection diodes D1–D4, input resistors R6–R9, load resistors R10 and R11, and bias resistors R12 and R13. The feedback resistors R1 and R2 are shunted by bandwidth limiting capacitors C1 and C2. The capacitor C3 is connected across the output of the input stage 20 and cooperates with R10 and R11 to introduce a pole in the transfer function, that cancels out the zero introduced by C1, R1; C2, R2. Resistors R14, R15, and capacitors C4 and C5 form a positive supply decoupling network while the resistor R16 and capacitors C6 and C7 form a negative supply decoupling network. The capacitor C10 is a compensating capacitor for the operational amplifier A1.

There are several advantages associated with the forced differential feedback amplifying system of the present invention. Since both the in-phase feedback signal through the resistor R1 and the out-of-phase feedback signal through the resistor R2 are forced to be exact replicas of the output signal, a common mode feedback signal is no longer present at the output terminals of the input stage 20. Thus, no Miller capacitance multiplication occurs at the input stage 20. The capacitive feedback path across the input source through the drain-gate electrodes of the transistors 26 and 28 will no longer result in amplifier instability. In fact, the system of the present invention is stable with the input terminals completely open. In addition, the effect of source capacitance to common is completely cancelled out so that no additional trimmer capacitors are required to achieve a fully balanced input impedance and thus, the input capacitance balance is not affected by temperature variations. Further, the system of the present invention exhibits very low electrical noise for given input devices because of the reduced number of input transistors.

Having thus described my invention what I claim is:

1. A differential feedback amplifying system having balanced input capacity comprising:

a differential input, differential output amplifier stage including first and second three terminal amplifier means each having input, output, and common terminals, a common resistor interconnecting said common terminals;

a first operational amplifier having inverting and non-inverting inputs and a single ended output, means coupling the output terminal of said first amplifier means to said inverting input and coupling the output terminal of said second amplifier means to said non-inverting input;

a differential feedback loop including an in-phase channel and an out-of-phase channel, said in-phase channel including a resistor connecting the output of said first operational amplifier to the common terminal of said first amplifier means;

said out-of-phase channel including an inverting operational amplifier and a resistor, said resistor interconnecting the output of said inverting operational amplifier with the common terminal of said second amplifier means;

and means for receiving input signals at the input terminals of said amplifier means whereby an output signal proportional to the difference of said input signals is produced at the output of said first operational amplifier.

2. The system defined in claim 1 wherein said input, output, and common terminals of said amplifier means are the gate, drain and source electrodes of field effect transistors.

3. The system defined in claim 2 further including bias means connecting the source electrodes to a negative supply voltage, load means connecting the drain electrode to a positive supply voltage, a compensating capacitor interconnecting said drain electrodes, and an additional capacitor in parallel with each of said resistors in said channels.

* * * * *